(12) United States Patent
Arai et al.

(10) Patent No.: US 7,138,706 B2
(45) Date of Patent: Nov. 21, 2006

(54) SEMICONDUCTOR DEVICE AND METHOD FOR MANUFACTURING THE SAME

(75) Inventors: Yoshiyuki Arai, Kyoto (JP); Takashi Yui, Shiga (JP); Yoshiaki Takeoka, Kyoto (JP); Fumito Itou, Osaka (JP); Kouichi Yamauchi, Osaka (JP); Yasutake Yaguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 178 days.

(21) Appl. No.: 10/608,295

(22) Filed: Jun. 24, 2003

(65) Prior Publication Data

US 2004/0051168 A1    Mar. 18, 2004

(30) Foreign Application Priority Data

Jun. 25, 2002  (JP)  ............................. 2002-185201

(51) Int. Cl.
    *H01L 21/44*    (2006.01)
(52) U.S. Cl. ................ 257/678; 257/777; 257/787; 257/675; 257/690; 257/737; 257/706; 438/106; 438/126; 438/107; 438/127
(58) Field of Classification Search ................ 257/672, 257/673, 675, 666, 678, 706, 707, 777, 787, 257/737, 690; 438/106, 109, 112, 121, 123, 438/124, 127, 107, 126
    See application file for complete search history.

(56) References Cited

U.S. PATENT DOCUMENTS

| 5,701,233 A | * | 12/1997 | Carson et al. ............... 361/735 |
|---|---|---|---|
| 5,900,669 A | * | 5/1999 | Knapp et al. ............... 257/701 |
| 6,069,023 A | * | 5/2000 | Bernier et al. ............... 438/107 |
| 6,133,637 A | * | 10/2000 | Hikita et al. ................. 257/777 |
| 6,340,846 B1 | * | 1/2002 | LoBianco et al. ........... 257/783 |
| 6,433,277 B1 | * | 8/2002 | Glenn ......................... 174/52.4 |
| 6,583,502 B1 | * | 6/2003 | Lee et al. .................... 257/686 |
| 6,610,560 B1 | * | 8/2003 | Pu et al. ..................... 438/122 |
| 6,707,140 B1 | * | 3/2004 | Nguyen et al. ............. 257/686 |

FOREIGN PATENT DOCUMENTS

| JP | 2001-057404 | 2/2001 |
|---|---|---|
| JP | 2001-168270 | 6/2001 |
| JP | 2001-267470 | 9/2001 |
| JP | 2001-298110 | 10/2001 |
| JP | 2001-308258 | 11/2001 |
| JP | 2002-124627 | 4/2002 |

* cited by examiner

*Primary Examiner*—Eddie C. Lee
*Assistant Examiner*—Junghwa Im
(74) *Attorney, Agent, or Firm*—Hamre, Schumann, Mueller & Larson, P.C.

(57) ABSTRACT

A semiconductor device with excellent heat dissipation characteristics that can achieve a high reliability when mounted in electronic equipment such as a cellular phone or the like and a method for manufacturing the same are provided. The semiconductor device includes a substrate, a plurality of semiconductor chips mounted on the substrate by stacking one on top of another, and an encapsulation resin layer made of encapsulation resin. Among the plurality of semiconductor chips, a first semiconductor chip as an uppermost semiconductor chip is mounted with a surface thereof on which a circuit is formed facing toward the substrate, and the encapsulation resin layer is formed so that at least a surface of the first semiconductor chip opposite to the surface on which the circuit is formed and a part of side surfaces of the first semiconductor chip are exposed to the outside of the encapsulation resin layer.

20 Claims, 11 Drawing Sheets

SEMICONDUCTOR DEVICE AND METHOD FOR MANUFACTURING THE SAME

BACKGROUND OF THE INVENTION

1. Field of the Invention

The present invention relates generally to a semiconductor device and a method for manufacturing the same.

2. Description of the Related Art

In methods for manufacturing a semiconductor device by using a plurality of semiconductor chips with different functions, the semiconductor device is manufactured by cutting out the semiconductor chips with different functions from a plurality of wafers obtained through different processes and using them in any desired combinations. Thus, in general, these methods are superior to methods for manufacturing a semiconductor device by integrating all the desired functions onto one chip in terms of manufacturing cost.

One of the above-described methods for manufacturing a semiconductor device by using a plurality of semiconductor chips with different functions is called a "chip-on-chip method", in which a plurality of semiconductor chips are stacked vertically and connected to each other via bumps.

FIG. 9 is a cross-sectional view showing one example of a semiconductor device manufactured by a conventional chip-on-chip method. As shown in FIG. 9, in the semiconductor device manufactured by the conventional chip-on-chip method, a second semiconductor chip 101b and a first semiconductor chip 101a are stacked on the substrate 103 in this order.

Electrical connection between the first semiconductor chip 101a as an uppermost semiconductor chip and the second semiconductor chip 101b provided below the first semiconductor chip 101a is achieved by connecting electrode pads (not shown) provided on a surface on which a circuit is formed (hereinafter, referred to simply as a "circuit surface") of the first semiconductor chip 101a to electrode pads (not shown) provided on a circuit surface of the second semiconductor chip 101b via bumps 102. These bumps 102 form a space between the first semiconductor chip 101a and the second semiconductor chip 101b, and the space is filled with an underfill material 104.

The second semiconductor chip 101b is bonded to the substrate 103 with an adhesive (a die bonding material) 105. Electrical connection between the second semiconductor chip 101b and the substrate 103 is achieved by connecting bonding pads (not shown) provided on the circuit surface of the second semiconductor chip 101b to electrode pads (not shown) provided on the substrate 103 via wires 106.

On the bottom of the substrate 103, lands 103a serving as terminals for connection to an external component or device are formed. The first semiconductor chip 101a and the second semiconductor chip 101b on the substrate 103 are encapsulated in an encapsulation resin layer 107 formed of encapsulation resin.

As shown in FIG. 9, according to the chip-on-chip method, a plurality of semiconductor chips can be electrically connected to each other via bumps. Thus, the first semiconductor chip 101a and the second semiconductor chip 101b may be manufactured by separate processes. For example, by manufacturing the first semiconductor chip 101a through a process designed specifically for the manufacture of DRAM and the second semiconductor chip 101b through a process designed specifically for the manufacture of CMOS and then connecting the first semiconductor chip 101a and the second semiconductor chip 101b by flip chip bonding, a high-performance semiconductor device with DRAM can be manufactured at a low cost without performing a process integrating a process for manufacturing DRAM with a process for manufacturing CMOS.

Furthermore, in the semiconductor device shown in FIG. 9, the circuit thereof is constituted by the two separate elements, i.e., the first semiconductor chip 101a and the second semiconductor chip 101b. This allows the interconnection length to be shortened, thereby improving the manufacturing yield. In addition, the semiconductor device shown in FIG. 9 also is advantageous in that, since the semiconductor chips are stacked vertically, it requires a smaller area, thus achieving miniaturization of the semiconductor device.

Next, processes for manufacturing a semiconductor device according to a conventional chip-on chip method will be described with reference to FIGS. 10A to 10F. FIGS. 10A to 10F are cross-sectional views, each illustrating one part of the method for manufacturing the semiconductor device shown in FIG. 9. The parts illustrated from FIG. 10A through FIG. 10F are a series of major parts of the process. Specifically, FIG. 10A is a die bonding process, FIG. 10B is a flip chip bonding process, FIG. 10C is an underfill process, FIG. 10D is a wire bonding process, and FIG. 10E is an encapsulating process.

First, as shown in FIG. 10A, the second semiconductor chip 101b is disposed on the substrate 103 via the adhesive 105. The second semiconductor chip 101b is disposed with the circuit surface thereof having the electrode pads (not shown) facing up (i.e., facing toward the direction opposite to the substrate 103). Thereafter, the adhesive 105 is cured with heat. The heating may be performed with either an in-line system or a batch processing with an oven. Thus, the second semiconductor chip 101b is fixed on the substrate 103.

Next, as shown in FIG. 10B, the first semiconductor chip 101a is mounted on the second semiconductor chip 101b by flip chip bonding with the circuit surface thereof facing down (i.e., facing toward the substrate 103). It is to be noted here that the bumps 102 are formed on the electrode pads (not shown) provided on the circuit surface of the first semiconductor chip 101a. Accordingly, the electrode pads (not shown) of the first semiconductor chip 101a and the electrode pads (not shown) of the second semiconductor chip 101b are electrically connected to each other via the bumps 102.

Then, as shown in FIG. 10C, the underfill material 104 made of liquid resin is filled into the space formed between the first semiconductor chip 101a and the second semiconductor chip 101b by the bumps 102. Thus, the first semiconductor chip 101a and the second semiconductor chip 101b are bonded with the underfill material 104 and fixed to each other.

After that, as shown in FIG. 10D, the bonding pads (not shown) of the second semiconductor chip 101b are electrically connected to the electrode pads (not shown) of the substrate 103 via the wires 106.

Subsequently, as shown in FIG. 10E, the stacked product including the substrate 103, the second semiconductor chip 101b, and the first semiconductor chip 101a, obtained by the processes illustrated from FIGS. 10A through 10D, is placed inside a mold 110 that has been heated to a molding temperature.

The mold 110 is formed with an upper half 110a having a recess 108a and a lower half 110b having a recess 108b. The recess 108a is formed so that it can accommodate the second semiconductor chip 101b and the first semiconductor chip 101a, and the recess 108b is formed so that the substrate 103 fits therein. These recesses 108a and 108b define the cavity 108 inside the mold 110.

Next, melted encapsulation resin is transferred into a space defined by the inner wall of the recess 108a of the upper half 110a and the stacked product obtained by the processes illustrated from FIGS. 10A through 10D. Thus, the space is filled with the encapsulation resin. This state is maintained for 1 to 2 minutes so that the encapsulation resin is cured to form the encapsulation resin layer 107.

Then, as shown in FIG. 10F, the stacked product including the substrate 103, the second semiconductor chip 101b, and the first semiconductor chip 101a is taken out from the mold 110, and excess resin is removed from the encapsulation resin layer 107. Thus, the semiconductor device as shown in FIG. 9 is completed.

By the way, when the semiconductor device with such a large scale is operated at high speed, an increase in power consumption is inevitable, which results in increased heat generation. Although the chip-on-chip method is suitable for the manufacture of a high-performance semiconductor device with a large scale as described above, a semiconductor device manufactured by this method has a problem in that the heat dissipation characteristics thereof are not very good because a plurality of stacked semiconductor chips are encapsulated in encapsulation resin. Thus, when such a semiconductor device is used in electronic equipment such as a cellular phone or the like, malfunction and/or fault may be caused by the heat generated by the circuit.

In view of the above-described problem, JP 2001-57404 A discloses improving heat dissipation characteristics of a semiconductor device manufactured by the chip-on-chip method by grinding the upper surface of the encapsulation resin layer so that the upper surface of the uppermost semiconductor chip is exposed.

One example of such a semiconductor device is shown in FIG. 11. FIG. 11 is a cross-sectional view showing another example of a semiconductor device manufactured by a conventional chip-on-chip method. In FIG. 11, the same components as those in FIG. 9 are indicated with the same reference numerals.

The semiconductor device shown in FIG. 11 is obtained by grinding the encapsulation resin layer 107 covering the upper surface (the surface opposite to the circuit surface) of the first semiconductor chip 101a until the upper surface of the first semiconductor chip 101a is exposed. The upper surface of the first semiconductor chip 101a and the upper surface of the encapsulation resin layer 107 surrounding it are coplanar.

Furthermore, JP 2001-267470 A discloses improving the heat dissipation characteristics of the semiconductor device by attaching a heat sink to the surface of the uppermost semiconductor chip exposed from the encapsulation resin layer.

However, according to the techniques disclosed in JP 2001-57404 A and JP 2001-267470 A, a process of grinding the semiconductor device must be performed after the encapsulating process (FIG. 10E), which reduces the productivity and production efficiency. Also, the environmental impact of the debris produced during the grinding process cannot be disregard.

On the other hand, in recent years, in the field of electronic equipment such as a cellular phone or the like, there has been a demand for further reduction in the size and weight of such equipment as well as further expansion of their functions. In order to meet this recent demand, the packaging of circuit components is becoming denser and denser, thereby increasing the power consumption of such equipment. Thus, improving the heat dissipation characteristics is important in order to improve the reliability of the electronic equipment such as a cellular phone or the like. In particular, since some of the processors to be used in a cellular phone consume several watts of power, it is extremely important to improve the heat dissipation characteristics of the electronic equipment employing such processors.

SUMMARY OF THE INVENTION

The present invention is intended to solve the above-mentioned conventional problems. It is an object of the present invention to provide a semiconductor device with excellent heat dissipation characteristics that can achieve a high reliability when mounted in electronic equipment such as a cellular phone or the like and a method for manufacturing the same.

In order to achieve the above object, a semiconductor device according to the present invention includes: a substrate; a plurality of semiconductor chips mounted on the substrate by stacking one on top of another; and an encapsulation resin layer. Among the plurality of semiconductor chips, a first semiconductor chip as an uppermost semiconductor chip is mounted with a surface thereof on which a circuit is formed facing the substrate, and the encapsulation resin layer is formed so that at least a surface of the first semiconductor chip opposite to the surface on which the circuit is formed and a part of side surfaces of the first semiconductor chip are exposed to the outside of the encapsulation resin layer.

In the semiconductor device according to the present invention, a lowermost semiconductor chip among the plurality of semiconductor chips may be bonded to the substrate with an adhesive. Also, the first semiconductor chip and a second semiconductor chip provided immediately below the first semiconductor chip may be electrically connected to each other via bumps. In this case, the bumps form a space between the first semiconductor chip and the second semiconductor chip, and the space may be filled with the encapsulation resin of the encapsulation resin layer.

Furthermore, in the semiconductor device according to the present invention, a portion of the first semiconductor chip may be bonded to a portion of the second semiconductor chip with an adhesive. Also, a lowermost semiconductor chip among the plurality of semiconductor chips may be electrically connected to the substrate via a wire.

Furthermore, in the semiconductor device according to the present invention, the substrate may be a lead frame. In this case, it is preferable that, a lowermost semiconductor chip among the plurality of semiconductor chips is bonded to one surface of a die pad portion of the lead frame and the encapsulation resin layer is formed so the other surface of the die pad portion is exposed to the outside of the encapsulation resin layer.

In the semiconductor device according to the present invention, on a second semiconductor chip provided immediately below the first semiconductor chip, a third semiconductor chip (other than the first semiconductor chip) may be mounted along with the first semiconductor chip. In this case, it is preferable that both the first semiconductor chip and the third semiconductor chip are electrically connected to the second semiconductor chip via bumps.

Furthermore, in the semiconductor device according to the present invention, a heat dissipatior may be provided on the surface of the first semiconductor chip exposed to the outside of the encapsulation resin layer. In this case, it is preferable that the heat dissipator is a metal film or a metal heat sink.

To achieve the above object, a method for manufacturing a semiconductor device according to the present invention, which is a method of manufacturing a semiconductor device including a substrate, a plurality of semiconductor chips mounted on the substrate by stacking one on top of another, and an encapsulation resin layer made of encapsulation resin, includes the steps of: (a) mounting a plurality of semiconductor chips on a substrate by stacking one on top of another so that a first semiconductor chip as an uppermost semiconductor chip is mounted with a surface thereof on which a circuit is formed facing the substrate; and (b) forming an encapsulation resin layer so that at least a surface of the first semiconductor chip opposite to the surface on which the circuit is formed and a part of side surfaces of the first semiconductor chip are exposed to the outside of the encapsulation resin layer.

In the above-described method of the present invention, it is preferable that the step (b) is carried out by placing a stacked product obtained by mounting the plurality of semiconductor chips on the substrate in the step (a) in a mold having a space capable of accommodating the stacked product, and injecting or transferring the encapsulation resin into the space, and the surface opposite to the surface on which the circuit is formed and the part of the side surfaces of the first semiconductor chip is allowed to be exposed to the outside of the encapsulation resin by: attaching a film member to a region opposing the first semiconductor chip in an inner wall of the mold that defines the space and bringing the film member into intimate contact with the surface opposite to the surface on which the circuit is formed and the part of the side surfaces of the first semiconductor chip when injecting or transferring the encapsulation resin.

Furthermore, in the above-described preferable aspect of the method of the present invention, it is preferable that the mold includes an upper half having a recess capable of accommodating at least the first semiconductor chip and the second semiconductor chip and a lower half having a recess that allows the substrate to fit therein, the film member is attached to an inner surface of the recess formed in the upper half so as to fit the shape of the inner surface, and the film member is brought into intimate contact with the surface opposite to the surface on which the circuit is formed and the part of the side surfaces of the first semiconductor chip by applying pressure between the upper half and the lower half.

Furthermore, in the above-described method of the present invention, in the step (a), a second semiconductor chip provided immediately below the first semiconductor chip may be mounted with a surface thereof on which a circuit is formed facing the first semiconductor chip, and the first semiconductor chip and the second semiconductor chip may be electrically connected to each other via bumps. In this aspect of the present invention, it is preferable that the method further includes the step of filling an underfill material into a space formed between the first semiconductor chip and the second semiconductor chip by the bumps.

Furthermore, in the above-described aspect of the method of the present invention, it is preferable that, in the step (a), an adhesive is applied to one portion of the surface of the second semiconductor chip on which the circuit is formed beforehand, and the first semiconductor chip is fixed to the second semiconductor chip with the adhesive.

Furthermore, in the above-described aspect of the method of the present invention, the encapsulation resin layer may be formed so that a space formed between the first semi-conductor chip and the second semiconductor chip by the bumps also is filled with the encapsulation resin for forming the encapsulation resin layer in the step (b).

These and other advantages of the present invention will become apparent to those skilled in the art upon reading and understanding the following detailed description with reference to the accompanying figures.

DETAILED DESCRIPTION OF THE INVENTION

Hereinafter, a semiconductor device and a method for manufacturing the same according to embodiments of the present invention will be described with reference to the accompanying drawings.

(Embodiment 1)

Figure 1:
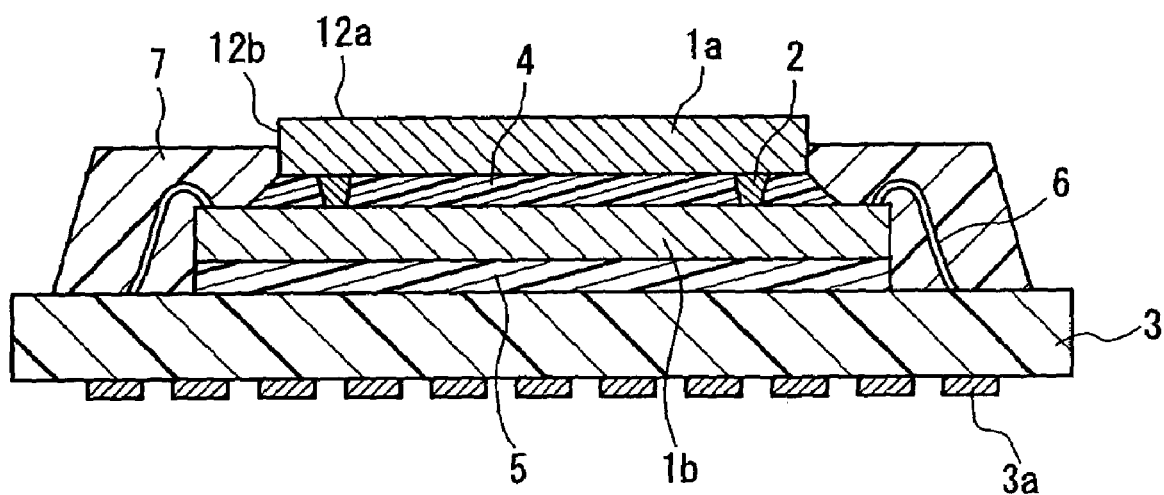
FIG. 1 is a cross-sectional view showing a configuration of a semiconductor device according to Embodiment 1 of the present invention.

A semiconductor device and a method for manufacturing the same according to Embodiment 1 will be described below with reference to FIGS. 1 and 2A to 2F. First, a semiconductor device according to Embodiment 1 will be described with reference to FIG. 1. FIG. 1 is a cross-sectional view showing a configuration of a semiconductor device according to Embodiment 1 of the present invention.

Figure 9:
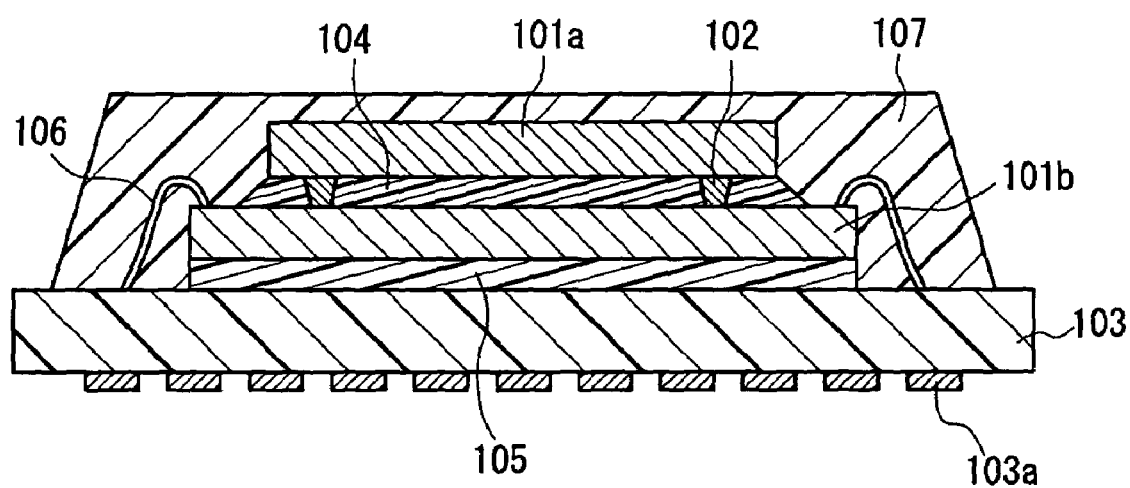
FIG. 9 is a cross-sectional view showing one example of a semiconductor device manufactured by a conventional chip-on-chip method.

As shown in FIG. 1, similar to the conventional semiconductor device described above with reference to FIG. 9, the semiconductor device according to Embodiment 1 includes a substrate 3, a first semiconductor chip 1a and second semiconductor chip 1b mounted on the substrate 3 by stacking the first semiconductor chip 1a on the second semiconductor chip 1b, and an encapsulation resin layer 7 formed of encapsulation resin.

The first semiconductor chip 1a as the uppermost semiconductor chip is mounted on the substrate 3 with the circuit surface thereof facing toward the substrate 3. On the other hand, the second semiconductor chip 1b as the lowermost semiconductor chip is mounted with the circuit surface thereof facing the first semiconductor chip 1a. Electrical connection between the first semiconductor chip 1a and the second semiconductor chip 1b is achieved by connecting electrode pads (not shown) provided on the circuit surface of the first semiconductor chip 1a to electrode pads (not shown) provided on the circuit surface of the second semiconductor chip 1b via bumps 2.

These bumps 2 form a space between the first semiconductor chip 1a and the second semiconductor chip 1b, and the space is filled with an underfill material 4. The second semiconductor chip 1b is bonded to the substrate 3 with an adhesive 5.

Electrical connection between the second semiconductor chip 1b and the substrate 3 is achieved by connecting bonding pads (not shown) provided on the circuit surface of the second semiconductor chip 1b to electrode pads (not shown) provided on the substrate 3 via wires 6. On the bottom of the substrate 3, lands 3a serving as terminals for connection to an external component or device are arranged in a grid pattern. The lands 3a may be provided with a metal ball.

As described above, the semiconductor device according to Embodiment 1 includes the components common to those in the conventional semiconductor device described above with reference to FIG. 9. However, the semiconductor device of Embodiment 1 differs from the conventional semiconductor device of FIG. 9 in the region encapsulated in the encapsulation resin layer 7, as will be described in the following.

Specifically, as shown in FIG. 1, in the semiconductor device according to Embodiment 1, the encapsulation resin layer 7 is formed so that a surface opposite to the circuit surface (hereinafter, referred to as a "rear surface") 12a and a part of side surfaces 12b of the first semiconductor chip are exposed to the outside of the encapsulation resin layer 7. Thus, the portion excluding the rear surface 12a and a part of the side surfaces 12b is encapsulated in the encapsulation resin layer 7. It is preferable that an area of the part of the side surfaces 12b that is exposed is not less than ¼ and not more than ⅘ of the total area of the side surfaces 12b.

Figure 11:
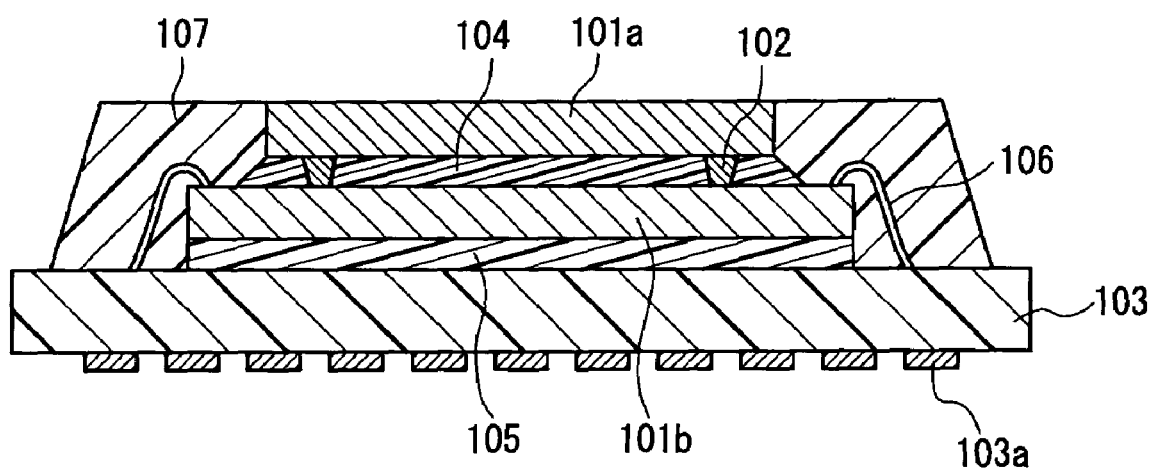
FIG. 11 is a cross-sectional view showing another example of a semiconductor device manufactured by a conventional chip-on-chip method.

As described above, in the semiconductor device according to Embodiment 1, not only the rear surface of the first semiconductor chip 1a as the uppermost semiconductor chip but also a part of the side surfaces of the same are exposed to the outside of the encapsulation resin layer. Therefore, the semiconductor device according to Embodiment 1 is superior to the conventional semiconductor devices described above with reference to FIGS. 9 and 11 in terms of heat dissipation characteristics.

In Embodiment 1, as the first semiconductor chip 1a and the second semiconductor chip 1b, semiconductor chips obtained from a generally used Si (silicon) wafer on which a plurality of semiconductor elements are formed is used. It is to be noted here that, in Embodiment 1, the first semiconductor chip 1a and the second semiconductor chip 1b may be obtained by forming a semiconductor element on a substrate made of a compound semiconductor such as SiGe, GaAs, GaP, or the like. The first semiconductor chip 1a and the second semiconductor chip 1b may be formed using the same or different materials. The bumps 2 may be formed using at least one material selected from Ag, Au, Cu, solder, and the like.

In Embodiment 1, a glass-fabric based epoxy substrate, flexible substrate made of polyimide resin, ceramic substrate, or the like, having a wiring pattern on one or both surfaces, may be used as the substrate 3. The wiring pattern can be formed, for example, by attaching a metal foil such as a copper foil or the like on one or both surface of the above-described substrates and then performing etching or the like of the metal foil.

As the substrate 3, the above-described epoxy substrate or the like having a wiring pattern on one or both surfaces may used alone, or a multilayer substrate including two or more of the above-described the above-described epoxy substrates or the like may be used. Furthermore, the substrate 3 may be a buildup substrate formed by stacking insulating layers having minute via holes and layers having a wiring pattern alternately on a base substrate.

The adhesive 5 used in Embodiment 1 is an adhesive generally called a die bonding material. For example, an adhesive containing thermosetting epoxy resin as a main component may be used as the adhesive 5. Also, the adhesive 5 may be a die bonding material whose thermal conductivity is improved by dispersing Ag, Pd, or the like therein. It is preferable to use the adhesive 5 in the form of paste or a film.

In Embodiment 1, thermosetting resin typified by thermosetting epoxy resin can be used as the encapsulation resin for forming the encapsulation resin layer 7 and as the underfill material 4. The resin used as the underfill material 4 preferably is in liquid form because it is filled into the space formed between the semiconductor chips.

The encapsulation resin for forming the encapsulation resin layer 7 may be in solid form or liquid form. In Embodiment 1, solid resin is used as the encapsulation resin. As will be described later, the encapsulation resin layer 7 is formed by melting solid encapsulation resin and then curing it in the mold. Furthermore, as the wires 6, a metal wire made of a metal such as Au, Al, or the like, or of an array containing them as a main component may be used.

Figure 2A:
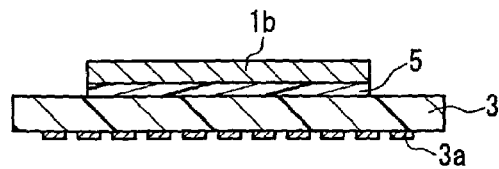
FIGS. 2A to 2F are cross-sectional views illustrating a series of major parts of a method for manufacturing the semiconductor device shown in FIG. 1.
Figure 2B:
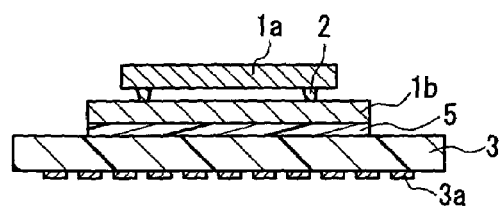
Figure 2C:
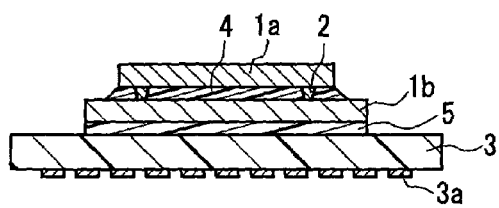
Figure 2D:
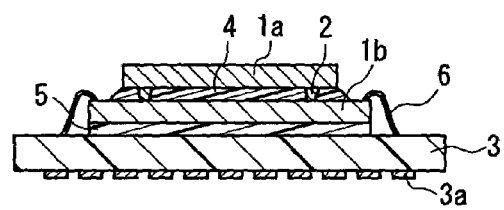
Figure 2E:
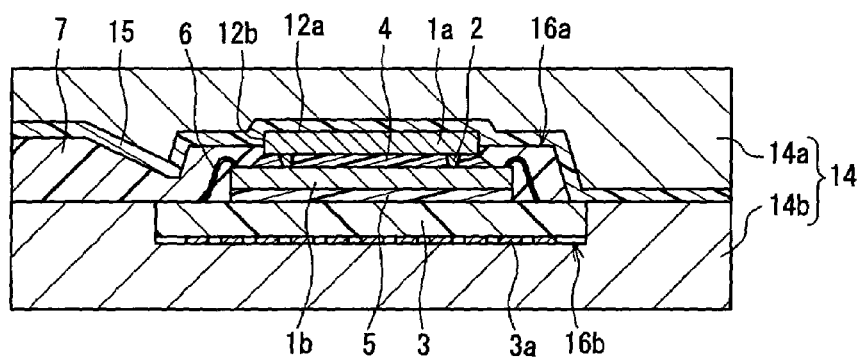

Next, a method for manufacturing a semiconductor device according to Embodiment 1 will be described with reference to FIGS. 2A to 2E. FIGS. 2A to 2F are cross-sectional views, each illustrating one part of the method for manufacturing the semiconductor device shown in FIG. 1. The parts illustrated from FIG. 2A through FIG. 2F are a series of major parts of the process. Specifically, FIG. 2A is a die bonding process, FIG. 2B is a flip chip bonding process, FIG. 2C is an underfill process, FIG. 2D is a wire bonding process, and FIG. 2E is an encapsulating process.

First, as shown in FIG. 2A, the second semiconductor chip 1b is disposed on the substrate 3 via the adhesive 5. The second semiconductor chip 1b is disposed with the circuit surface thereof having the electrode pads (not shown) facing up (i.e., facing toward the direction opposite to the substrate 3). Thereafter, the adhesive 5 is cured with heat. The heating may be performed with either an in-line system or a batch processing with an oven. Thus, the second semiconductor chip 1b is fixed on the substrate 3.

Next, as shown in FIG. 2B, the first semiconductor chip 1a having the bumps 2 on its circuit surface is mounted on the second semiconductor chip 1b by flip chip bonding with the circuit surface thereof facing down (i.e., facing toward the substrate 3).

In Embodiment 1, the position adjustment of the first semiconductor chip 1*a* with respect to the second semiconductor chip 1*b* is carried out before bonding the bumps 2 to the electrode pads (not shown) of the second semiconductor chip 1*b* so that the bumps 2 oppose the electrode pads of the second semiconductor chip 1*b* to fit therein. The bumps 2 are formed on the electrode pads (not shown) provided on the circuit surface of the first semiconductor chip 1*a*.

Thus, the electrode pads (not shown) of the first semiconductor chip 1*a* and the electrode pads (not shown) of the second semiconductor chip 1*b* are electrically connected to each other via the bumps 2.

Examples of the method for forming the bumps 2 include a printing method, a mask evaporation method, a stud bump method, a plating method, and a transfer method. Examples of the method for bonding the bumps 2 to the electrode pads of the second semiconductor chip 1*b* include melting the bumps 2 to bond them to the electrode pads; bonding the bumps 2 with previously added conductive paste; connecting the bumps 2 by holding them between the first semiconductor chip 1*a* and the second semiconductor chip 1*b* utilizing the shrinkage of the underfill material 4 (see FIG. 2C) due to the curing; and bonding the bumps 2 by applying ultrasonic wave thereto. The method to be used is selected as appropriate, depending on the material of the bumps 2.

Then, as shown in FIG. 2C, into the space formed between the first semiconductor chip 1*a* and the second semiconductor chip 1*b* by the bumps 2, the underfill material 4 made of liquid resin is filled by a dispensing method. Thereafter, the underfill material 4 is cured by being left at a predetermined temperature for a predetermined time so that the first semiconductor chip 1*a* and the second semiconductor chip 1*b* are bonded and fixed to each other.

After that, as shown in FIG. 2D, the bonding pads (not shown) of the second semiconductor chip 1*b* are electrically connected to the electrode pads (not shown) of the substrate 3 via the wires 6. In Embodiment 1, the substrate 3 and the second semiconductor chip 1*b* are heated, and then, the wires 6 are connected to the bonding pads of the second semiconductor chip 1*b* and to the electrode pads of the substrate 3 by pressure while applying ultrasonic waves to the wire.

It is to be noted here that the processes illustrated from FIG. 2A through FIG. 2D are the same as the conventional processed described above with reference to FIG. 10A to FIG. 10D.

Subsequently, as shown in FIG. 2E, the stacked product including the substrate 3, the second semiconductor chip 1*b*, and the first semiconductor chip 1*a*, obtained by the processes from the die bonding process illustrated in FIG. 2A through the wire bonding process illustrated in FIG. 2D, is placed inside a mold 14 that has been heated to a molding temperature in the same manner as in the conventional process illustrated in FIG. 10E. In Embodiment 1, the molding temperature is set to be in the range from 165° C. to 185° C.

Figure 10A:
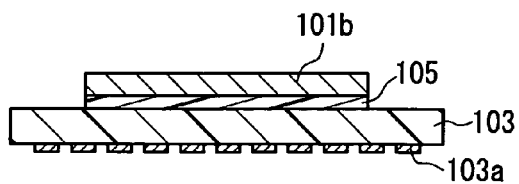
FIGS. 10A to 10F are cross-sectional views illustrating a series of major parts of a method for manufacturing the semiconductor device shown in FIG. 9.
Figure 10B:
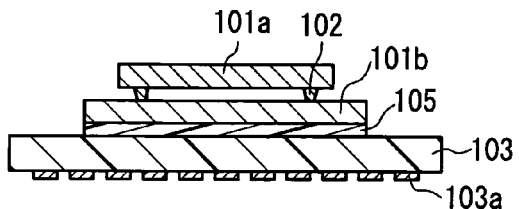
Figure 10C:
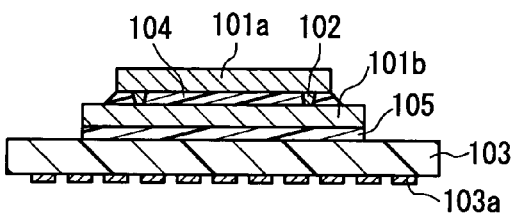
Figure 10D:
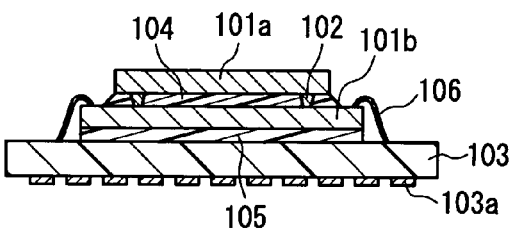
Figure 10E:
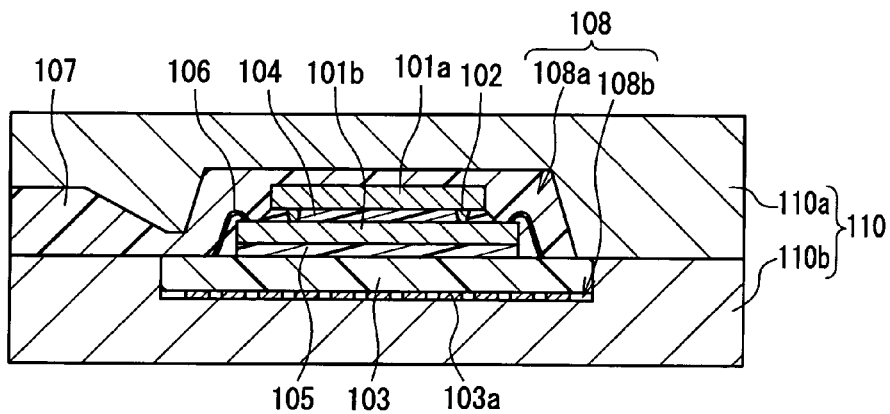
Figure 10F:
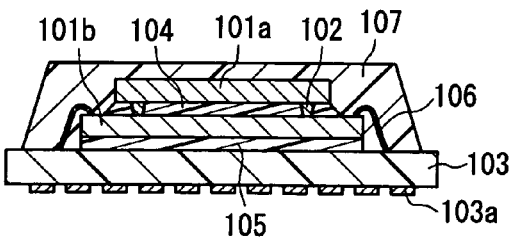

Furthermore, similar to the mold 110 as used in the conventional process illustrated in FIG. 10E, the mold 14 is formed with an upper half 14*a* having a recess 16*a* and a lower half 14*b* having a recess 16*b*. The recess 16*a* is formed so that it can accommodate at least the second semiconductor chip 1*b* and the first semiconductor chip 1*a*, and the recess 16*b* is formed so that the substrate 3 fits therein. These recesses 16*a* and 16*b* define the cavity inside the mold 14.

Next, as shown in FIG. 2E, melted encapsulation resin is transferred into a space defined by the inner wall of the recess 16*a* of the upper half 14*a* and the stacked product obtained by the processes illustrated from FIGS. 2A through 2D so that this space is filled with the encapsulation resin to form the encapsulation resin layer 7, as in the conventional process illustrated in FIG. 10E. In Embodiment 1, the encapsulation resin is filled into the space by performing transfer molding.

However, the process in Embodiment 1 differs from the conventional process illustrated in FIG. 10E in that the encapsulation resin layer 7 in Embodiment 1 is formed so that the encapsulation resin is in contact only with the portion excluding the rear surface 12*a* and a part of the side surfaces 12*b* of the first semiconductor chip 1*a*.

More specifically, in Embodiment 1, as shown in FIG. 2E, a mold releasing film 15 is attached to the region opposing the first semiconductor chip 1*a* in the inner wall of the upper half 14*a* that defines the cavity, i.e., the inner surface of the recess 16*a* formed in the upper half 14*a*. The mold releasing film 15 may be attached so as to fit the shape of the inner surface. Furthermore, in Embodiment 1, after placing the stacked product obtained by the processes illustrated from FIGS. 2A through 2D in the lower half 14*b* and then bonding the upper half 14*a* to the lower half 14*b*, a pressure is applied to the upper half 14*a* and the lower half 14*b*. Therefore, the rear surface 12*a* and a part of the side surfaces 12*b* of the first semiconductor chip 1*a* are pressed by the recess 16*a* of the upper half 14*a* with the mold releasing film 15 intervening therebetween. As a result, the rear surface 12*a* and a part of the side surfaces 12*b* of the first semiconductor chip 1*a* are brought into intimate contact with the mold releasing film 15.

If the liquid encapsulation resin obtained by melting solid encapsulation resin is transferred in this state, the mold releasing film 15 prevents the encapsulation resin from coming into contact with the rear surface 12*a* and a part of the side surfaces 12*b* of the first semiconductor chip 1*a*. Thus, when the encapsulation resin is cured, the encapsulation resin layer 7 that exposes the rear surface 12*a* and a part of the side surfaces 12*b* of the first semiconductor chip 1*a* is formed.

In Embodiment 1, in order to eliminate the voids in the encapsulation resin layer 7, the encapsulation resin is cured while applying a pressure of 50 to 200 kgf/cm$^3$ to the upper half 14*a* and the lower half 14*b* and maintaining this state for 1 to 2 minutes.

In Embodiment 1, as the mold releasing film 15, fluorocarbon resin film may be used, for example. Specific examples of such a film include a product named "AFLEX" manufactured by Asahi Glass Co., Ltd. It is preferable that the mold releasing film 15 has a thickness in the range from 50 μm to 250 μm, for example.

When the space is filled with the encapsulation resin with the mold releasing film 15 being disposed inside the mold 14, the following effects can be obtained in addition to the effect of exposing the rear surface 12*a* and a part of the side surfaces 12*b* of the first semiconductor chip 1*a* from the encapsulation resin layer 7. That is, it is possible to reduce the chances that damage such as cracking or chipping might occur in the first semiconductor chip 1*a* and the second semiconductor chip 1*b* due to the pressure applied to the upper half 14*a* and the lower half 14*b*. Besides, it is possible to reduce the chances that the encapsulation resin layer 7 might be adhered to the upper half 14*a* and the like when releasing the molded article from the mold 14, thereby allowing the workability to be improved.

In Embodiment 1, it is preferable that the mold releasing film 15 is attached to the upper half 14*a* by vacuum adsorption so that a certain tension is applied to the mold releasing film 15 to allow the mold releasing film 15 to be attached in a wrinkle free state. The vacuum adsorption can be performed by providing a through hole (not shown) extending from the inner surface of the recess 16a to the outside of the upper half 14a and then discharging the air in the cavity from this through hole. In Embodiment 1, in order to keep the mold releasing film 15 clean at all times, a device that automatically supplies and winds up the mold releasing film 15 preferably is used.

Figure 2F:
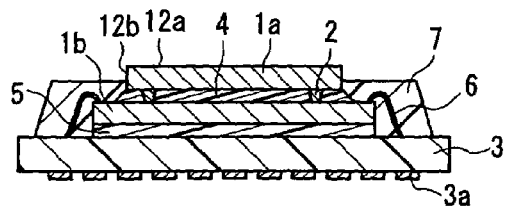

Then, as shown in FIG. 2F, the stacked product including the substrate 3, the second semiconductor chip 1b, and the first semiconductor chip 1a is taken out from the mold 14, and excess resin is removed from the encapsulation resin layer 7. Thus, the semiconductor device as shown in FIG. 1 is completed. In this process, the mold releasing film 15 spontaneously comes off from the stacked product because it is adhered to the recess 16a of the upper half 14a. Furthermore, in Embodiment 1, an after cure process preferably is added after the process illustrated in FIG. 2F in order to cure the encapsulation resin layer 7 completely.

As specifically described above, by the method of manufacturing a semiconductor device according to Embodiment 1, the encapsulation resin layer 7 can be formed so that the rear surface 12a and a part of the side surfaces 12b of the first semiconductor chip 1a are exposed to the outside of the encapsulation resin layer 7. Therefore, the semiconductor device manufactured by the method of Embodiment 1 is superior to the conventional semiconductor devices described above with reference to FIGS. 9 and 11 in terms of heat dissipation characteristics.

Furthermore, in the method of manufacturing a semiconductor device according to Embodiment 1, the rear surface 12a and a part of the side surfaces 12b of the first semiconductor chip 1a are exposed to the outside of the encapsulation resin layer 7 by the encapsulating process, as described above with reference to FIG. 2F. Therefore, in the method of Embodiment 1, the process of grinding the encapsulation resin layer 7 covering the rear surface of the first semiconductor chip 1a to expose the rear surface of the first semiconductor chip 1a as required in the method of manufacturing the conventional semiconductor device described above with reference to FIG. 11 need not be performed after the encapsulating process. Therefore, according to the chip-on-chip method of Embodiment 1, a semiconductor device can be manufactured easily with higher productivity. Besides, since the method of Embodiment 1 does not require grinding the encapsulation resin layer 7 of the semiconductor device, no debris is produced from the encapsulation resin layer 7 and the first semiconductor chip 1a. In addition, it is possible to cut down the manufacturing cost because inexpensive solid resin can be used as the encapsulation resin for forming the encapsulation resin layer 7.

Furthermore, in the method of manufacturing a semiconductor device according to Embodiment 1, the order in which the processes illustrated in FIGS. 2A to 2D are performed may be different from that described above. For example, a semiconductor device may be manufactured by mounting the first semiconductor chip 1a on the second semiconductor chip 1b that is not yet cut out from the wafer by flip chip bonding; filling the underfill material 4 into the space formed between the first semiconductor chip 1a and the second semiconductor chip 1b that is not yet cut out from the wafer; cutting out the second semiconductor chip 1b from the wafer; and then bonding the second semiconductor chip 1b cut out from the wafer to the substrate 3 with the adhesive 5.

Alternatively, a semiconductor device may be manufactured by electrically connecting the bonding pads provided on the circuit surface of the second semiconductor chip 1b to the electrode pads provided on the substrate 3 via the wires 6; thereafter, connecting the second semiconductor chip 1b and the first semiconductor chip 1a by flip chip bonding; and filling the underfill material 4 into the space formed between the first semiconductor chip 1a and the second semiconductor chip 1b.

In Embodiment 1, plasma cleaning preferably is performed after the wire bonding process and the die bonding process in order to improve the connection between the substrate 3 and the second semiconductor chip 1b via the wires 6 and to improve the contact between the encapsulation resin layer 7 and the stacked product including the substrate 3, the second semiconductor chip 1b, and the first semiconductor chip 1a.

(Embodiment 2)

Figure 3:
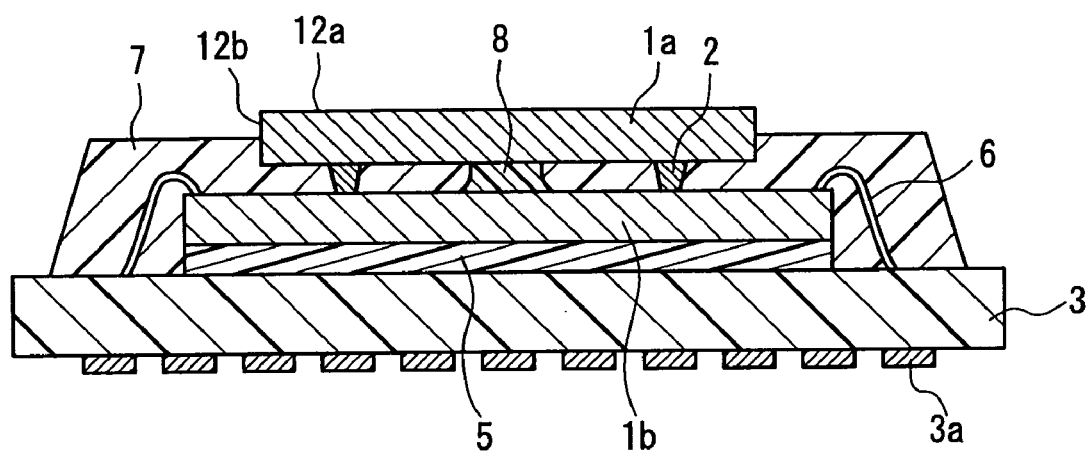
FIG. 3 is a cross-sectional view showing a configuration of a semiconductor device according to Embodiment 2 of the present invention.

A semiconductor device and a method for manufacturing the same according to Embodiment 2 will be described below with reference to FIGS. 3 and 4A to 4E. First, a semiconductor device according to Embodiment 2 will be described with reference to FIG. 3. FIG. 3 is a cross-sectional view showing a configuration of a semiconductor device according to Embodiment 2 of the present invention.

As shown in FIG. 3, the semiconductor device according to Embodiment 2 differs from the semiconductor device according to Embodiment 1 in that: (1) a portion of a first semiconductor chip 1a is fixed to a portion of a second semiconductor chip 1b with an adhesive 8; and (2) instead of the underfill material 4 (see FIG. 1), encapsulation resin for forming an encapsulation resin layer 7 is transferred into a space formed between the first semiconductor chip 1a and the second semiconductor chip 1b by bumps 2.

Except for these two points, the semiconductor device according to Embodiment 2 has the same configuration as that of the semiconductor device according to Embodiment 1. Thus, as shown in FIG. 3, also in the semiconductor device of Embodiment 2, a rear surface 12a of the first semiconductor chip 1a as an uppermost semiconductor chip and a part of side surfaces 12b of the same are not encapsulated in the encapsulation resin and exposed to the outside of the encapsulation resin layer 7.

In FIG. 3, the same components as those in FIG. 1 are indicated with the same reference numerals and their explanation thus has been omitted.

In the semiconductor device according to Embodiment 2, the materials of the first semiconductor chip 1a, the second semiconductor chip 1b, the substrate 3, an underfill material 4, an adhesive 5, and the encapsulation resin layer 7 may be the same as those described in Embodiment 1.

Figure 4A:
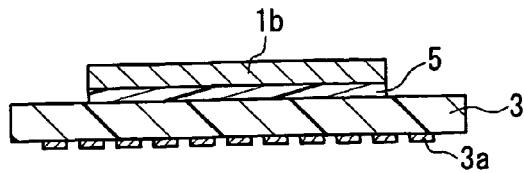
FIGS. 4A to 4E are cross-sectional views illustrating a series of major parts of a method for manufacturing the semiconductor device shown in FIG. 3.
Figure 4B:
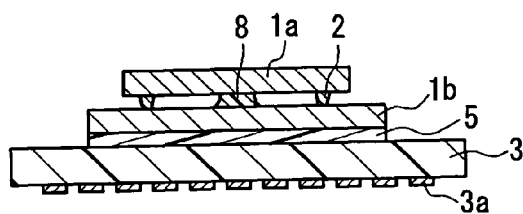
Figure 4C:
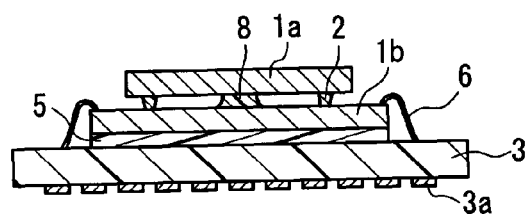
Figure 4D:
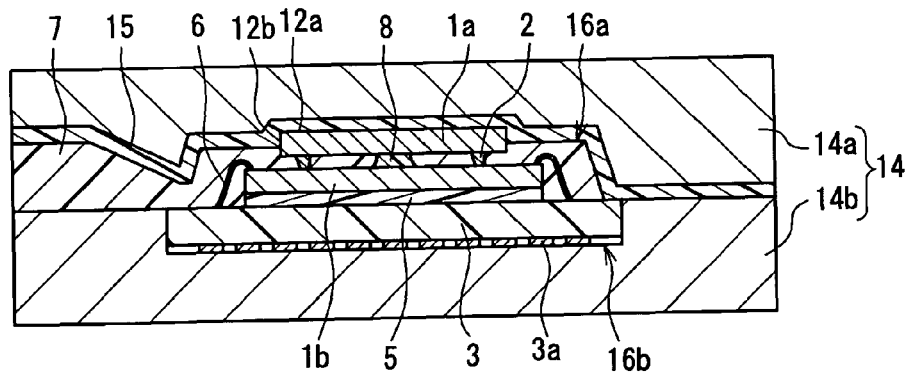

Next, a method for manufacturing a semiconductor device according to Embodiment 2 will be described with reference to FIGS. 4A to 4E. FIGS. 4A to 4E are cross-sectional views, each illustrating one part of the method for manufacturing the semiconductor device shown in FIG. 3. The parts illustrated from FIG. 4A through FIG. 4E are a series of major parts of the process. Specifically, FIG. 4A is a die bonding process, FIG. 4B is a flip chip bonding process, FIG. 4C is a wire bonding process, and FIG. 4D is an encapsulating process.

First, as shown in FIG. 4A, the second semiconductor chip 1b is disposed on the substrate 3 via the adhesive 5, and the adhesive 5 is cured with heat by performing the heating with either an in-line system or a batch processing with an oven, as in the process illustrated in FIG. 2A of Embodiment 1.

Next, as shown in FIG. 4B, the first semiconductor chip 1a having the bumps 2 on its circuit surface is mounted on the second semiconductor chip 1b by flip chip bonding with the circuit surface thereof facing down (i.e., facing toward the substrate 3), as in the process illustrated in FIG. 2B of Embodiment 1. Also in Embodiment 2, the electrode pads (not shown) of the first semiconductor chip 1a and the electrode pads (not shown) of the second semiconductor chip 1b are electrically connected to each other via the bumps 2.

However, unlike the method of Embodiment 1, in the method of Embodiment 2, the adhesive 8, which is either a liquid adhesive or a film adhesive, is applied to one portion of the circuit surface of the second semiconductor chip 1b, and the first semiconductor chip 1a is bonded to the second semiconductor chip 1b with this adhesive 8. The adhesive 8 is positioned so as not to interfere with the flip chip bonding of the first semiconductor chip 1a to the second semiconductor chip 1b.

As described above, in Embodiment 2, the first semiconductor chip 1a is fixed to the second semiconductor chip 1b with the adhesive 8, without using an underfill material as in Embodiment 1. Thus, it is possible to reduce the chances that the impact given to the substrate 3, the first semiconductor chip 1a, and the second semiconductor chip 1b during the below-described encapsulating process illustrated in FIG. 4B or the like might cause the problems such that the first semiconductor chip 1a might be displaced and that the connected portion (i.e., flip chip bonding portion) of the first semiconductor chip 1a to the second semiconductor chip 1b might be damaged.

In Embodiment 2, thermosetting resin typified by epoxy resin preferably is used as the adhesive 8. The formation of the bumps 2 and the connection of the bumps 2 to the electrode pads of the second semiconductor chip 1b can be carried out in the same manner as in Embodiment 1. After the first semiconductor chip 1a is bonded to the second semiconductor chip 1b with the adhesive 8, they may be left until the adhesive 8 is cured, if necessary.

After that, as shown in FIG. 4C, the bonding pads (not shown) of the second semiconductor chip 1b are electrically connected to the electrode pads (not shown) of the substrate 3 via the wires 6, as in the process illustrated in FIG. 2D of Embodiment 1.

Subsequently, as shown in FIG. 4D, the stacked product including the substrate 3, the second semiconductor chip 1b, and the first semiconductor chip 1a, obtained by the processes from the die bonding process illustrated in FIG. 4A through the wire bonding process illustrated in FIG. 4C, is placed inside a mold 14 that has been heated to a molding temperature.

Also in Embodiment 2, a mold releasing film 15 is attached to the inner surface of the recess 16a formed in the upper half 14a of the mold 14 so as to fit the shape of the inner surface, as in the process illustrated in FIG. 2E of Embodiment 1. Furthermore, by applying a pressure to the upper half 14a and the lower half 14b, the rear surface 12a and a part of the side surfaces 12b of the first semiconductor chip 1a are brought into intimate contact with the mold releasing film 15.

After that, the encapsulation resin is transferred and then cured in the same manner as in the process illustrated in FIG. 2E of Embodiment 1. As a result, the encapsulation resin layer 7 that exposes the rear surface 12a and a part of the side surfaces 12b of the first semiconductor chip 1a is formed.

However, in the method of Embodiment 2, unlike the method of Embodiment 1, the space between the first semiconductor chip 1a and the second semiconductor chip 1b also is filled with the encapsulation resin because this space is not filled with the underfill material, as shown in FIG. 4D. Furthermore, in the method of Embodiment 2, the encapsulation resin is filled into the space by performing transfer molding. According to the transfer molding, it is possible to apply pressure to the encapsulation resin.

Therefore, as compared with the case where the space is filled with the underfill material utilizing the capillary phenomenon as in Embodiment 1, Embodiment 2 can further improve the contact of the first semiconductor chip 1a and the second semiconductor chip 1b with the resin filling the space between them, and can further reduce the chances that voids might be generated in this resin. As a result, it is possible to improve the reliability of the semiconductor device.

As described above, in Embodiment 2, the first semiconductor chip 1a is fixed to the second semiconductor chip 1b with the adhesive 8. Thus, it is possible to reduce the chances that the pressure from the encapsulation resin for forming the encapsulation resin layer 7 might cause the problems such that the first semiconductor chip 1a might be displaced and that the connected portion (i.e., flip chip bonding portion) of the first semiconductor chip 1a to the second semiconductor chip 1b might be damaged.

Also in Embodiment 2, in order to eliminate the voids in the encapsulation resin layer 7, the encapsulation resin is cured while applying a pressure of 50 to 200 kgf/cm$^3$ to the upper half 14a and the lower half 14b and maintaining this state for 1 to 2 minutes, as in Embodiment 1.

Figure 4E:
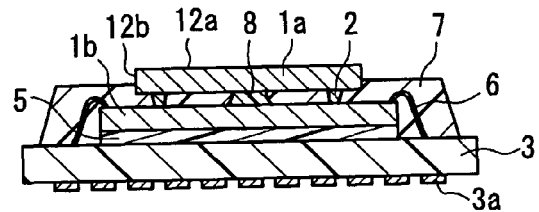

Then, as shown in FIG. 4E, the stacked product including the substrate 3, the second semiconductor chip 1b, and the first semiconductor chip 1a is taken out from the mold 14, and excess resin is removed from the encapsulation resin layer 7. Thus, the semiconductor device as shown in FIG. 3 is completed. Furthermore, also in Embodiment 2, an after cure process preferably is added in order to cure the encapsulation resin layer 7 completely.

As described above, according to the semiconductor device and the method for manufacturing the same of Embodiment 2, the same effects as those described in Embodiment 1 can be obtained. In addition, according to the semiconductor device and the method for manufacturing the same of Embodiment 2, the following effects also can be obtained.

When the space between the first semiconductor chip 1a and the second semiconductor chip 1b is filled with an underfill material, there is an interface between the underfill material and the encapsulation resin layer 7. Sometimes, moisture absorbed in these resins may collect on such an interface. In this case, if the semiconductor device is heated by reflowing or the like, the moisture present at the interface may be vaporized and expanded to damage the first semiconductor chip 1a, the second semiconductor chip 1b, and the encapsulation resin layer 7.

In contrast, according to Embodiment 2, because the space between the first semiconductor chip 1a and the second semiconductor chip 1b is filled with the encapsulation resin for forming the encapsulation resin layer 7, there is no interface between the resin filling this space and the encapsulation resin layer 7. Therefore, the above-described problem does not arise even when the semiconductor device is heated by reflowing or the like.

Furthermore, when the space between the first semiconductor chip 1a and the second semiconductor chip 1b is filled with an underfill material, the so-called "fillet" is formed around an inlet through which the underfill material is filled. In this case, it is necessary to prevent the electrode pads of the second semiconductor chip 1b to be connected to the wires 6 from coming into contact with the fillet. Thus, limitations are imposed on the size of a semiconductor chip to be used as the second semiconductor chip 1b and on the position of the electrode pads.

In contrast, according to Embodiment 2, such limitations are not caused because the underfill material is not used. Therefore, greater flexibility can be given on the size of the semiconductor chip, and greater design freedom is allowed with regard to the position of the electrode pads on the circuit surface of the semiconductor chip. Therefore, it is possible to manufacture a variety of semiconductor devices. Besides, in Embodiment 2, the underfill process illustrated in FIG. 2C of Embodiment 1 can be omitted, which allows the productivity to be improved.

Furthermore, also in the method of manufacturing a semiconductor device according to Embodiment 2, the order in which the processes illustrated in FIGS. 4A to 4D are performed may be different from that described above, as in the method of Embodiment 1. For example, a semiconductor device may be manufactured by bonding the first semiconductor chip 1a to the second semiconductor chip 1b that is not yet cut out from the wafer with the adhesive 8; thereafter, cutting out the second semiconductor chip 1b from the wafer; and then bonding the second semiconductor chip 1b cut out from the wafer to the substrate 3 with the adhesive 5.

Alternatively, a semiconductor device may be manufactured by electrically connecting the bonding pads provided on the circuit surface of the second semiconductor chip 1b to the electrode pads provided on the substrate 3 via the wires 6; and then bonding the second semiconductor chip 1b and the first semiconductor chip 1a with the adhesive 8.

Also in Embodiment 2, plasma cleaning preferably is performed after the wire bonding process and the die bonding process in order to improve the connection between the substrate 3 and the second semiconductor chip 1b via the wires 6 and to improve the contact between the encapsulation resin layer 7 and the stacked product including the substrate 3, the second semiconductor chip 1b, and the first semiconductor chip 1a, as in Embodiment 1.

(Embodiment 3)

Figure 5:
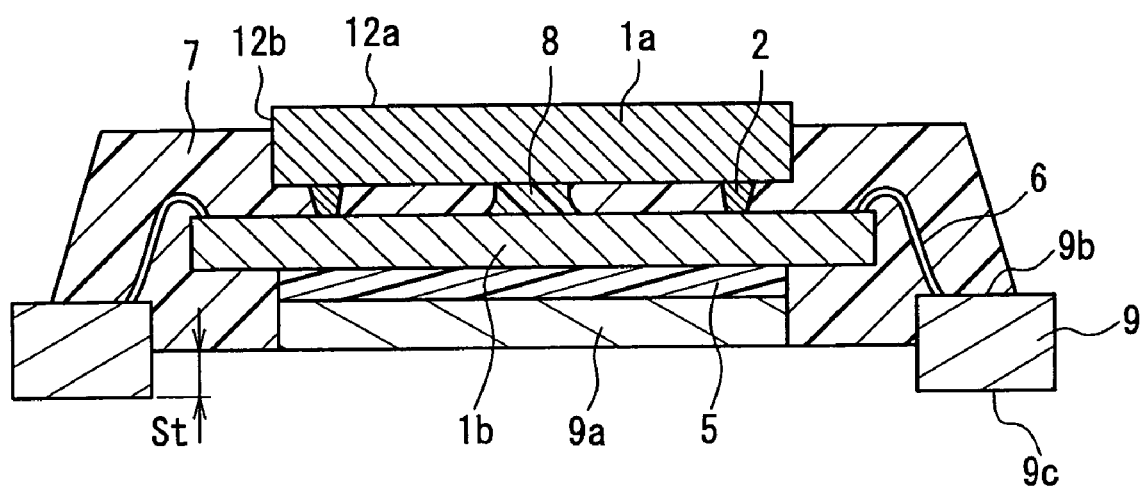
FIG. 5 is a cross-sectional view showing a configuration of a semiconductor device according to Embodiment 3 of the present invention.

A semiconductor device and a method for manufacturing the same according to Embodiment 3 will be described below with reference to FIGS. 5 and 6A to 6E. First, a semiconductor device according to Embodiment 3 will be described with reference to FIG. 5. FIG. 5 is a cross-sectional view showing a configuration of a semiconductor device according to Embodiment 3 of the present invention.

As shown in FIG. 5, the semiconductor device according to Embodiment 3 differs from the semiconductor device according to Embodiment 2 in that a lead frame 9 is used as a substrate on which a first semiconductor chip 1a and a second semiconductor chip 1b are mounted.

Furthermore, as shown in FIG. 5, the lead frame 9 includes a die pad portion 9a on which a second semiconductor chip 1b is mounted, an inner lead portion 9b to which wires 6 are connected, and a land portion 9c to which an external component or device is connected. Examples of the material for forming the lead frame 9 include Cu and an FeNi alloy.

In FIG. 5, St denotes a length of a portion of the land portion 9c extruding from the lower surface the encapsulation resin layer 7, which generally is referred to as a "standoff length". Securing the standoff length is important in order to mount the semiconductor device of Embodiment 3 securely on an external substrate or the like. The reason for this is that an insufficient standoff length might cause a short circuit when the semiconductor device is mounted on the external substrate or the like.

The semiconductor device according to Embodiment 3 has the same configuration as that of the semiconductor device according to Embodiment 2 except that a lead frame 9 is used as a substrate on which a first semiconductor chip 1a and a second semiconductor chip 1b are mounted. In FIG. 5, the same components as those in FIGS. 1 and 3 are indicated with the same reference numerals.

In the semiconductor device according to Embodiment 3, the second semiconductor chip 1b is fixed to the die pad portion 9a with an adhesive 5. The first semiconductor chip 1a is connected to the second semiconductor chip 1b by flip chip bonding. Furthermore, as in the semiconductor device of Embodiment 2, the first semiconductor chip 1a is fixed to the second semiconductor chip 1b with the adhesive 8.

Also in the semiconductor device of Embodiment 3, as shown in FIG. 5, a rear surface 12a of the first semiconductor chip 1a as an uppermost semiconductor chip and a part of side surfaces 12b of the same are not encapsulated in the encapsulation resin and exposed to the outside of an encapsulation resin layer 7, as in the semiconductor devices of Embodiments 1 and 2.

The semiconductor device according to Embodiment 3 can be divided into several types, such as QFN (Quad Flat Non-leaded Package), SON (Small Outline Non-leaded Package), LGA (Land Grid Array), BGA (Ball Grid Array), and the like, depending on the form of the lead exposed to the outside as an electrode.

Figure 6A:
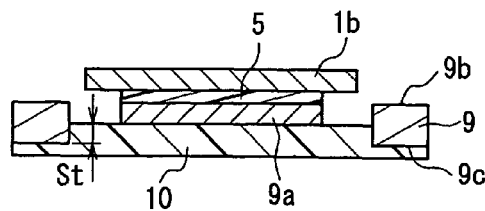
FIGS. 6A to 6E are cross-sectional views illustrating a series of major parts of a method for manufacturing the semiconductor device shown in FIG. 5.
Figure 6B:
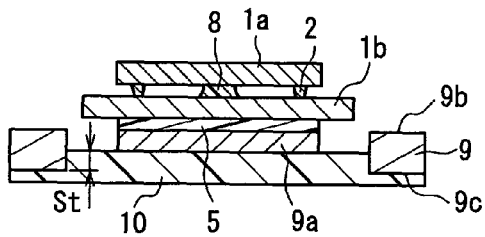
Figure 6C:
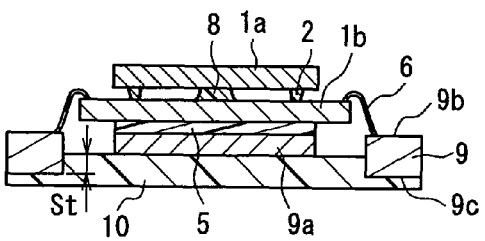
Figure 6D:
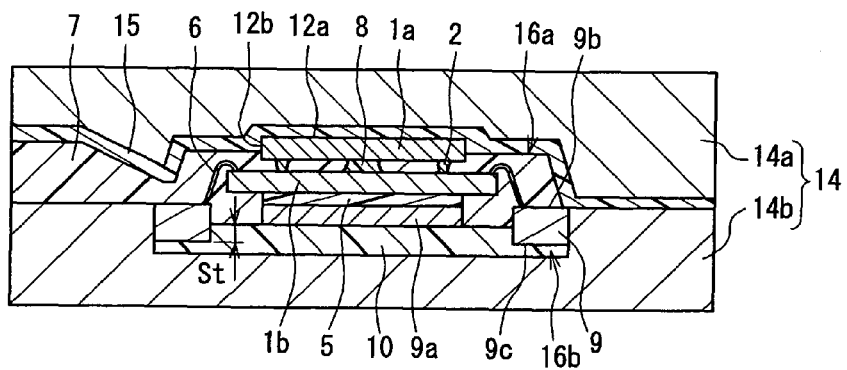

Next, a method for manufacturing a semiconductor device according to Embodiment 3 will be described with reference to FIGS. 6A to 6E. FIGS. 6A to 6E are cross-sectional views, each illustrating one part of the method for manufacturing the semiconductor device shown in FIG. 5. The parts illustrated from FIG. 6A through FIG. 6E are a series of major parts of the process. Specifically, FIG. 6A is a die bonding process, FIG. 6B is a flip chip bonding process, FIG. 6C is a wire bonding process, and FIG. 6D is an encapsulating process.

First, as shown in FIG. 6A, the second semiconductor chip 1b is disposed on the die pad portion 9a of the lead frame 9 via the adhesive 5. On the surface of the lead frame 9 opposite to the surface on which the second semiconductor chip 1b is mounted, a sealing film 10 is attached so as to cover at least the rear surface (the surface opposite to the surface on which the second semiconductor chip 1b is mounted) of the die pad portion 9a and the land portion 9c.

The purpose of attaching the sealing film 10 is to reduce the chances that the encapsulation resin might leak during the encapsulating process to be described later. Furthermore, in order to secure the standoff length St of the land portion 9c, the sealing film 10 is attached in such a manner that the land portion 9c is embedded in the sealing film 10.

Thereafter, the adhesive 5 is cured with heat by performing the heating with either an in-line system or a batch processing with an oven. As the sealing film 10, polyimide resin may be used. The first semiconductor chip 1a, the second semiconductor chip 1b, and the adhesive 5 used in Embodiment 3 are the same as those described in Embodiments 1 and 2.

Next, as shown in FIG. 6B, the first semiconductor chip 1a having the bumps 2 on its circuit surface is mounted on the second semiconductor chip 1b by flip chip bonding with the circuit surface thereof facing down (i.e., facing toward the lead frame 9). Also in Embodiment 3, the electrode pads (not shown) of the first semiconductor chip 1a and the electrode pads (not shown) of the second semiconductor chip 1b are electrically connected to each other via the bumps 2.

As shown in FIG. 6B, in the semiconductor device according to Embodiment 3, the first semiconductor chip 1a is bonded to the second semiconductor chip 1b with the adhesive 8, as in the process illustrated in FIG. 4B of Embodiment 2. Furthermore, as in the method of Embodiment 2, the space formed between the first semiconductor chip 1a and the second semiconductor chip 1b by bumps 2 is not filled with an underfill material. As will be described later, the space is filled with encapsulation resin.

After that, as shown in FIG. 6C, the bonding pads (not shown) of the second semiconductor chip 1b are electrically connected to the electrode pads (not shown) of the inner lead portion 9b of the lead frame 9 via the wires 6, as in the process illustrated in FIG. 4C of Embodiment 2.

Subsequently, as shown in FIG. 6D, the stacked product including the lead frame 9, the second semiconductor chip 1b, and the first semiconductor chip 1a, obtained by the processes from the die bonding process illustrated in FIG. 6A through the wire bonding process illustrated in FIG. 6C, is placed inside a mold 14 that has been heated to a molding temperature, as in the process illustrated in FIG. 4D of Embodiment 2.

Also in Embodiment 3, a mold releasing film 15 is attached to the inner surface of the recess 16a formed in the upper half 14a of the mold 14 so as to fit the shape of the inner surface, as in the process illustrated in FIG. 4D of Embodiment 2. Furthermore, by applying a pressure to the upper half 14a and the lower half 14b, the rear surface 12a and a part of the side surfaces 12b of the first semiconductor chip 1a are brought into intimate contact with the mold releasing film 15. In Embodiment 3, the recess 16b of the lower half 14b is formed according to the shape of the lead frame 9 to which the sealing film 10 is attached.

After that, the encapsulation resin is transferred and then cured in the same manner as in the process illustrated in FIG. 4D of Embodiment 2. As a result, the encapsulation resin layer 7 that exposes the rear surface 12a and a part of the side surfaces 12b of the first semiconductor chip 1a is formed. Furthermore, also in Embodiment 3, the space between the first semiconductor chip 1a and the second semiconductor chip 1b is filled with the encapsulation resin, as in Embodiment 2.

In Embodiment 3, during this process, the chances that the encapsulation resin for forming the encapsulation resin layer 7 might leak into the land portion 9c is reduced by the sealing film 10. In addition, the sealing film 10 allows the necessary standoff length St to be secured.

Figure 6E:
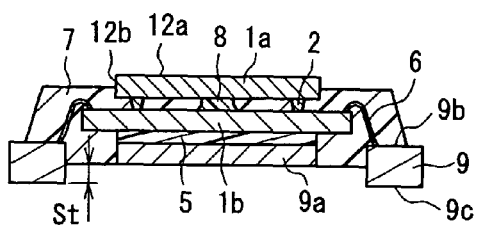

Then, as shown in FIG. 6E, the stacked product including the lead frame 9, the second semiconductor chip 1b, and the first semiconductor chip 1a is taken out from the mold 14. Then, excess resin is removed from the encapsulation resin layer 7 and the sealing film 10 is peeled off. Thus, the semiconductor device as shown in FIG. 5 is completed.

Also in Embodiment 3, an after cure process preferably is added in order to cure the encapsulation resin layer 7 completely. In the case where the after cure process is added, the sealing film 10 preferably is peeled off after the after cure process in order to reduce the chances that the land portion 9c might be soiled.

Therefore, according to the semiconductor device and the method for manufacturing the same of Embodiment 3, the same effects as those described in Embodiment 1 can be obtained. In addition, according to the semiconductor device and the method for manufacturing the same of Embodiment 3, the same effects as those described in Embodiment 2 also can be obtained.

As described above, in the semiconductor device according to Embodiment 3, the die pad portion 9a and the land portion 9c of the lead frame 9 is exposed to the outside of the encapsulation resin layer 7. Therefore, the semiconductor device according to Embodiment 3 is superior to the semiconductor devices according to Embodiments 1 and 2 in terms of heat dissipation characteristics.

The lead frame 9 used as a substrate in Embodiment 3 is much less expensive than the substrates (see FIGS. 1, 2A to 2F, 3, and 4A to 4E) formed of polyimide resin, ceramics, or the like. Thus, according to Embodiment 3, it is possible to cut down the manufacturing cost.

Furthermore, also in the method of manufacturing a semiconductor device according to Embodiment 3, the order in which the processes illustrated in FIGS. 6A to 6C are performed may be different from that described above, as in the method according to Embodiment 1. For example, a semiconductor device may be manufactured by bonding the first semiconductor chip 1a on the second semiconductor chip 1b that is not yet cut out from the wafer with the adhesive 8; thereafter, cutting out the second semiconductor chip 1b from the wafer; and then bonding the second semiconductor chip 1b cut out from the wafer to the lead frame 9 with the adhesive 5.

Alternatively, a semiconductor device may be manufactured by connecting the bonding pads provided on the circuit surface of the second semiconductor chip 1b to the inner lead portion 9b of the lead frame 9 via the wires 6; and then bonding the second semiconductor chip 1b and the first semiconductor chip 1a with the adhesive 8.

Also in Embodiment 3, plasma cleaning preferably is performed after the wire bonding process and the die bonding process in order to improve the connection between the inner lead portion 9b of the lead frame 9 and the second semiconductor chip 1b via the wires 6 and to improve the contact between the encapsulation resin layer 7 and the stacked product including the lead frame 9, the second semiconductor chip 1b, and the first semiconductor chip 1a.

(Embodiment 4)

Figure 7A:
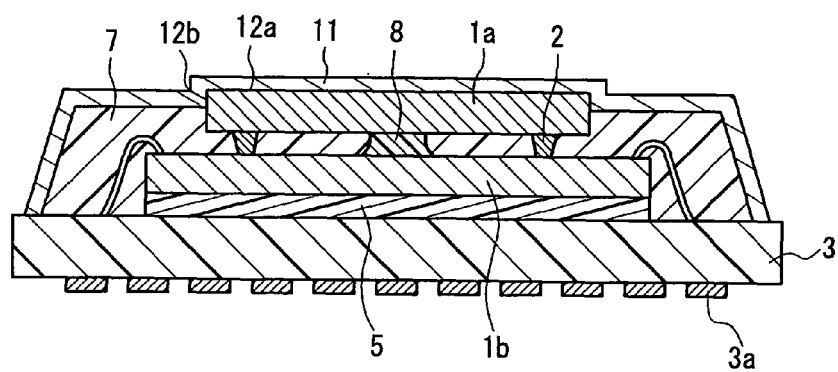
FIGS. 7A and 7B are cross-sectional views, each showing a configuration of a semiconductor device according to Embodiment 4 of the present invention. The semiconductor devices shown in FIGS. 7A and 7B differ from each other in their heat dissipators.
Figure 7B:
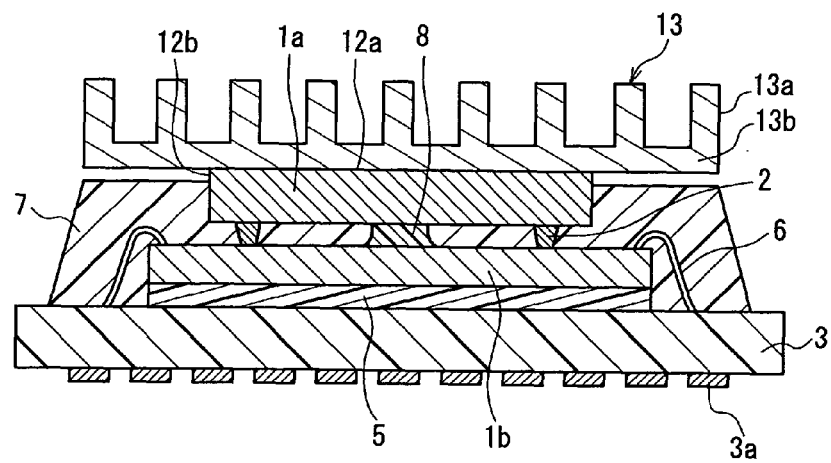

A semiconductor device according to Embodiment 4 will be described below with reference to FIGS. 7A and 7B. FIGS. 7A and 7B are cross-sectional views, each showing a configuration of a semiconductor device according to Embodiment 4 of the present invention. The semiconductor devices shown in FIGS. 7A and 7B differ from each other in their heat dissipators.

As shown in FIGS. 7A and 7B, a semiconductor device according to Embodiment 4 is obtained by providing the semiconductor device of Embodiment 2 with a heat dissipator. The heat dissipator may be attached to the surface of the first semiconductor chip 1a exposed from the encapsulation resin layer 7. Therefore, the heat dissipation characteristics are improved further in the semiconductor device of Embodiment 4 than in the semiconductor device of Embodiment 2. In FIGS. 7A and 7B, the same components as those in FIG. 3 are indicated with the same reference numerals.

Specifically, in the semiconductor device shown in FIG. 7A, a metal film 11 is used as the heat dissipator. The metal film 11 is formed so as to cover the rear surface 12a and a part of the side surfaces 12b of the first semiconductor chip 1a, which are exposed to the outside of the encapsulation resin layer 7, and further the upper surface and the side surfaces of the encapsulation resin layer 7. Thus, heat radiated from the rear surface 12a and a part of the side surfaces 12b of the first semiconductor chip 1a is diffused throughout the metal film 11. As a result, heat dissipation characteristics of the semiconductor device are improved.

Examples of the method for forming the metal film 11 shown in FIG. 7A include sputtering. Examples of the material for forming the metal film 11 include metals having a high thermal conductivity, such as Al, Cu, Ti, and the like.

On the other hand, in the semiconductor device shown in FIG. 7B, a metal heat sink 13 including a flat-shaped base 13b and a plurality of fins 13a arranged in parallel on the base 13b is used as the heat dissipator. The base 13b and the fins 13a may be formed integrally. The base 13b is bonded to the rear surface 12a of the first semiconductor chip 1a with an adhesive.

As the adhesive used for bonding the base 13b to the rear surface 12a of the first semiconductor chip 1a, it is preferable to use an adhesive having a high thermal conductivity. Examples of such an adhesive include thermosetting epoxy resin-based adhesives containing a solder and/or a metal.

Examples of the material for forming the metal heat sink 13 include metals having a high thermal conductivity, such as Al, Cu, Ti, and the like. Examples of the method for forming the heat sink 13 include casting. When the heat sink 13 is formed by casting, the cost required for forming the heat sink 13 can be made lower than that required for forming the metal film 11 shown in FIG. 7A.

The shape of the heat sink 13 is not specifically limited as long as it can improve the heat dissipation characteristics of the semiconductor device. However, the shape including a plurality of fins 13a as shown in FIG. 7B is preferable in view of the heat dissipation characteristics.

(Embodiment 5)

Figure 8A:
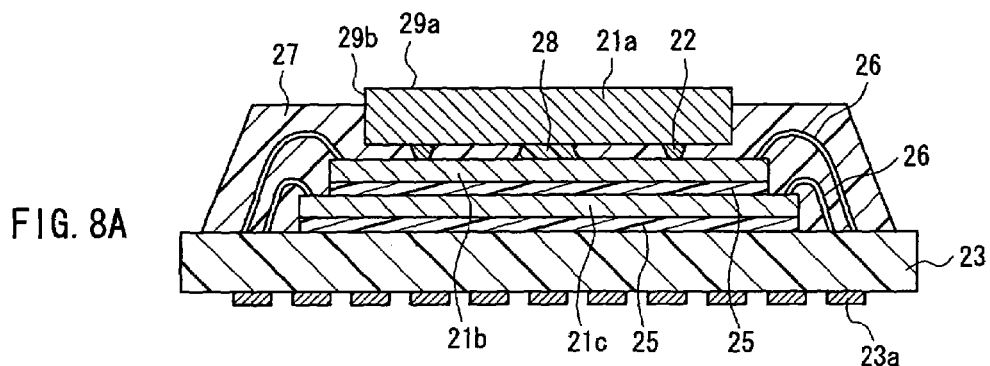
FIGS. 8A to 8C are cross-sectional views, each showing a configuration of a semiconductor device according to Embodiment 5 of the present invention. The semiconductor devices shown in FIGS. 8A to 8C differ from one another in their mounting methods.
Figure 8B:
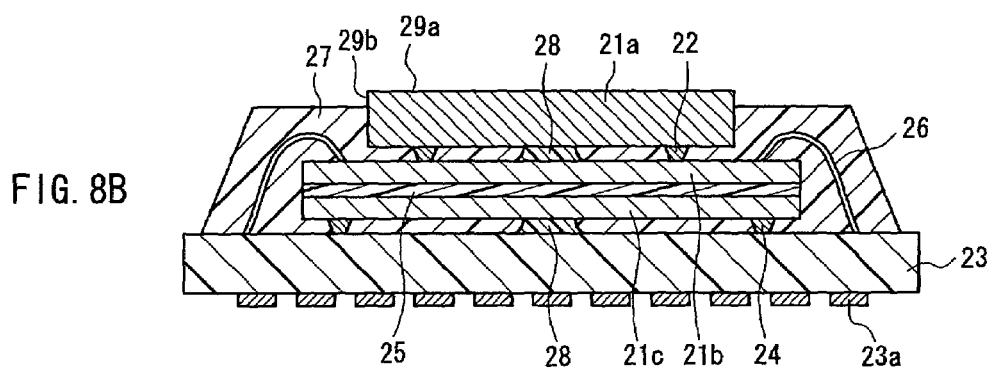
Figure 8C:
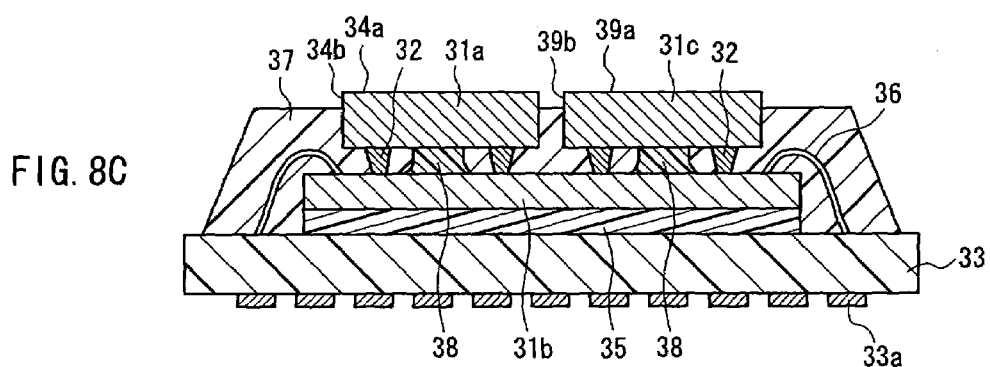

A semiconductor device according to Embodiment 5 will be described below with reference to FIGS. 8A to 8C. FIGS. 8A to 8C are cross-sectional views, each showing a configuration of a semiconductor device according to Embodiment 5 of the present invention. The semiconductor devices shown in FIGS. 8A to 8C differ from one another in their mounting method.

Semiconductor devices according to Embodiment 5 as shown in FIGS. 8A to 8C differ from the semiconductor devices according to Embodiments 1 to 4 in that they include a third semiconductor chip in addition to first and second semiconductor chips. The respective semiconductor devices of Embodiment 5 will be described specifically in the following.

FIG. 8A shows an example in which a third semiconductor chip 21c is added to a semiconductor device of Embodiment 2. As shown in FIG. 8A, in this semiconductor device, the third semiconductor chip 21c, a second semiconductor chip 21b, and a first semiconductor chip 21a are stacked on a substrate 23 in this order. Reference numeral 23a denotes lands provided on the bottom of the substrate 23.

The third semiconductor chip 21c is bonded to the substrate 23 with an adhesive 25 with the circuit surface thereof facing the second semiconductor chip 21b. Electrical connection between the third semiconductor chip 21c and the substrate 23 is achieved by connecting bonding pads (not shown) provided on the circuit surface of the third semiconductor chip 21c to electrode pads (not shown) provided on the substrate 23 via wires 26.

The second semiconductor chip 21b is bonded to the circuit surface of the third semiconductor chip 21c with the adhesive 25 with the circuit surface thereof facing the first semiconductor chip 21a. The size of the second semiconductor chip 21b is set to be such that the bonding pads (not shown) provided on the circuit surface of the third semiconductor chip 21c are not covered with the second semiconductor chip 21b.

Electrical connection between the second semiconductor chip 21b and the substrate 23 also is achieved by connecting bonding pads (not shown) provided on the circuit surface of the second semiconductor chip 21b to electrode pads (not shown) provided on the substrate 23 via wires 26.

The first semiconductor chip 21a is bonded to the second semiconductor chip 21b with an adhesive 28, which may be located at the central portion of these chips, with the circuit surface thereof facing the second semiconductor chip 21b, as in the semiconductor device according to Embodiment 2. The first semiconductor chip 21a and the second semiconductor chip 21b are electrically connected to each other via bumps 22.

As shown in FIG. 8A, an encapsulation resin layer 27 is formed so that a rear surface 29a and a part of side surfaces 29b of the first semiconductor chip 21a are exposed to the outside of the encapsulation resin layer 27. Furthermore, the space formed between the first semiconductor chip 21a and the second semiconductor chip 21b by bumps 22 is filled with the encapsulation resin for forming the encapsulation resin layer 27.

Therefore, according to the semiconductor device as shown in FIG. 8A, the same effects as those described in Embodiment 2 can be obtained. Besides, because this semiconductor device allows high-density packaging of the semiconductor chips, it is useful particularly as electronic equipment requiring high-density packaging, such as a cellular phone or the like.

FIG. 8B shows an example of a semiconductor device that differs from the semiconductor device shown in FIG. 8A in the method of mounting the third semiconductor chip 21c. Except for the method of mounting the third semiconductor chip 21c, the semiconductor device shown in FIG. 8B has the same configuration as that of the semiconductor device shown in FIG. 8A. Also in the semiconductor device shown in FIG. 8B, an encapsulation resin layer 27 is formed so that a rear surface 29a and a part of side surfaces 29b of the first semiconductor chip 21a are exposed to the outside of the encapsulation resin layer 27.

In the semiconductor device shown in FIG. 8B, the third semiconductor chip 21c is mounted with the circuit surface thereof facing the substrate 23, and is electrically connected to the substrate 23 via bumps 24. Furthermore, the space formed between the third semiconductor chip 21c and the substrate 23 by bumps 24 is filled with the encapsulation resin for forming the encapsulation resin layer 27.

Thus, the second semiconductor chip 21b is bonded to the rear surface of the third semiconductor chip 21c with an adhesive 25. Because the second semiconductor chip 21b is bonded to the rear surface of the third semiconductor chip 21c in this manner, the size of the second semiconductor chip 21b may be set to be the same as that of the third semiconductor chip 21c.

Therefore, according to the semiconductor device as shown in FIG. 8B, the same effects as those described in Embodiment 2 also can be obtained, and high-density packaging of semiconductor chips also can be achieved. In addition, in the semiconductor device as shown in FIG. 8B, the degree of freedom in the design of the second semiconductor chip 21b is greater than in the semiconductor device as shown in FIG. 8A.

Similarly to FIG. 8A, FIG. 8C shows an example in which a third semiconductor chip 21c is added to a semiconductor device of Embodiment 2. However, in the semiconductor device shown in FIG. 8C, a third semiconductor chip 31c is positioned at the top of the stacked product along with a first semiconductor chip 31a.

As shown in FIG. 8C, both the third semiconductor chip 31c and the first semiconductor chip 31a are mounted on a second semiconductor chip 31b with their circuit surfaces facing the second semiconductor chip 31b. Both the third semiconductor chip 31c and the first semiconductor chip 31a are electrically connected to the second semiconductor chip 31b by flip chip bonding via bumps 32. Furthermore, the third semiconductor chip 31c and the first semiconductor chip 31a are bonded to the circuit surface of the second semiconductor chip 31b with adhesives 38, which are located at the central portions of the third semiconductor chip 31c and the first semiconductor chip 31a, respectively.

An encapsulation resin layer 37 is formed so that a rear surface 34a and a part of side surfaces 34b of the first semiconductor chip 31a positioned at the top of the stacked product are exposed to the outside of the encapsulation resin layer 37, and in addition, a rear surface 39a and a part of side surfaces 39b of the third semiconductor chip 31c similarly positioned at the top of the stacked product are exposed to the outside of the encapsulation resin layer 37.

The second semiconductor chip 31b is bonded to the substrate 33 via an adhesive 35, as in the semiconductor device of Embodiment 2. Reference numeral 33a denotes lands provided on the bottom of the substrate 33. Electrical connection between the second semiconductor chip 31b and the substrate 33 is achieved by connecting bonding pads (not shown) provided on the circuit surface of the second semiconductor chip 31b to electrode pads (not shown) provided on the substrate 33 via wires 36.

Therefore, according to the semiconductor device as shown in FIG. 8C, the same effects as those described in Embodiment 2 also can be obtained, and high-density packaging of semiconductor chips also can be achieved. In addition, according to the semiconductor device as shown in FIG. 8C, unlike the semiconductor devices shown in FIGS. 8A and 8B, a plurality of semiconductor chips with different functions, e.g., DRAM and a flash EEPROM, can be positioned at the top of the stacked product. Therefore, this semiconductor device is applicable particularly to the case where it is desired to improve the heat dissipation characteristics of a plurality of semiconductor chips.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    a substrate;
    a plurality of semiconductor chips mounted on the substrate by stacking one on top of another; and
    an encapsulation resin layer,
    wherein, among the plurality of semiconductor chips, a first semiconductor chip as an uppermost semiconductor chip is mounted with a surface thereof on which a circuit is formed facing the substrate, wherein the first semiconductor chip is directly and electrically connected to bumps and a second semiconductor chip provided immediately below the first semiconductor chip is directly and electrically connected to the bumps, and
    wherein the encapsulation resin layer is formed so that at least a surface of the first semiconductor chip opposite to the surface on which the circuit is formed and a portion adjacent to said opposite surface in each of side surfaces of the first semiconductor chip are exposed to the outside of the encapsulation resin layer and the surface on which the circuit is formed and a remaining portion in each of the side surfaces are covered with the encapsulation resin layer.

2. The semiconductor device according to claim 1, wherein, among the plurality of semiconductor chips, a lowermost semiconductor chip is bonded to the substrate wit an adhesive.

3. The semiconductor device according to claim 1, wherein the bumps are formed from Ag, Au, Cu, or solder.

4. The semiconductor device according to claim 3, wherein a portion of the first semiconductor chip is bonded to a portion of the second semiconductor chip with an adhesive.

5. The semiconductor device according to claim 1, wherein, among the plurality of semiconductor chips, a lowermost semiconductor chip is electrically connected to the substrate via a wire.

6. The semiconductor device according to claim 3, wherein the bumps form a space between the first semiconductor chip and the second semiconductor chip, and the space is filled with the encapsulation resin of the encapsulation resin layer.

7. The semiconductor device according to claim 1, wherein the substrate is a lead frame.

8. The semiconductor device according to claim 7, wherein, among the plurality of semiconductor chips, a lowermost semiconductor chip is bonded to one surface or a die pad portion of the lead frame, and wherein the encapsulation resin layer is formed so the other surface of the die pad portion is exposed to the outside of the encapsulation resin layer.

9. The semiconductor device according to claim 1, wherein, on a second semiconductor chip provided immediately below the first semiconductor chip, a third semiconductor chip is mounted along with the first semiconductor chip.

10. The semiconductor device according to claim 9, wherein both the first semiconductor chip and the third semiconductor chip are electrically connected to the second semiconductor chip via bumps.

11. The semiconductor device according to claim 1, wherein a heat dissipator is provided on the surface of the first semiconductor chip exposed to the outside of the encapsulation resin layer.

12. The semiconductor device according to claim 11, wherein the heat dissipator is a metal film or a metal heat sink.

13. A method for manufacturing a semiconductor device comprising a substrate, a plurality of semiconductor chips mounted on the substrate by stacking one on top of another, and an encapsulation resin layer made of encapsulation resin, the method comprising the steps of:
  a. mounting a plurality of semiconductor chips on a substrate by stacking one on top of another so that a first semiconductor chip as art uppermost semiconductor chip is mounted with a surface thereof on which a circuit is formed facing the substrate; and
  b. forming an encapsulation resin layer so that at least a surface of the first semiconductor chip opposite to die surface on which the circuit is formed and a portion adjacent to said opposite surface in each of side surfaces of the first semiconductor chip are exposed to the outside of the encapsulation resin layer and the surface on which the circuit is formed and a remaining portion in each of the side surfaces are covered with the encapsulation resin layer.

14. The method according to claim 13, wherein the step (b) is carried out by placing a stacked product obtained by mounting the plurality of semiconductor chips on the substrate in the step (a) in a mold having a space capable of accommodating the stacked product, and injecting or transferring the encapsulation resin into the space, the surface opposite to the surface on which the circuit is formed and the part of the side surfaces of the first semiconductor chip being allowed to be exposed to the outside of the encapsulation resin by:
  attaching to a film member to a region opposing the first semiconductor chip in an inner wall of the mold that defines the space, and
  bringing the film member into intimate contact with the surface opposite to the surface on which the circuit is formed and the part of the side surfaces of the first semiconductor chip when injecting or transferring the encapsulation resin.

15. The method according to claim 14, wherein the mold comprises an upper half having a recess capable of accommodating at least the first semiconductor chip and the second semiconductor chip and a lower half having a recess that allows the substrate to fit therein, the film member is attached to an inner surface of the recess formed in the upper half so as to fit the shape of the inner surface, and the film member is brought into intimate contact with the surface opposite to the surface on which the circuit is formed and the part of the side surfaces of the first semiconductor chip by applying pressure between the upper half and the lower half.

16. The method according to claim 13, wherein, in the step (a) a second semiconductor chip provided immediately below the first semiconductor chip is mounted with a surface thereof on which a circuit is formed facing the first semiconductor chip, and the first semiconductor chip and the second semiconductor chip are electrically connected to each other via bumps.

17. The method according to claim 16, further comprising the step of filling an underfill material into a space formed between the first semiconductor chip and the second semiconductor chip by the bumps.

18. The method according to claim 16, wherein, in the step (a), an adhesive is applied to one portion of the surface of the second semiconductor chip on which the circuit is formed beforehand, and the first semiconductor chip is fixed to the second semiconductor chip with the adhesive.

19. The method according to claim 16, wherein the bumps form a space between the first semiconductor chip and the second semiconductor chip, and, in the step (b), the encapsulation resin layer is formed so that the space also is filled with the encapsulation resin for forming the encapsulation resin layer.

20. The semiconductor device according to claim 1, wherein each of the first semiconductor chip and the second semiconductor chip comprises a plurality of electrode pads, and
  each of the electrode pads of the first semiconductor chip is connected to the corresponding electrode pad of the second semiconductor chip via a single bump.

* * * * *